(12) United States Patent
Sasaki et al.

(10) Patent No.: US 7,713,864 B2
(45) Date of Patent: May 11, 2010

(54) METHOD OF CLEANING SEMICONDUCTOR SUBSTRATE CONDUCTIVE LAYER SURFACE

(75) Inventors: Masaru Sasaki, Amagasaki (JP); Shinji Ide, Amagasaki (JP); Shigenori Ozaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 10/581,601

(22) PCT Filed: Dec. 3, 2004

(86) PCT No.: PCT/JP2004/018066

§ 371 (c)(1),
(2), (4) Date: Jun. 5, 2006

(87) PCT Pub. No.: WO2005/055305

PCT Pub. Date: Jun. 16, 2005

(65) Prior Publication Data

US 2007/0111528 A1 May 17, 2007

(30) Foreign Application Priority Data

Dec. 4, 2003 (JP) .............................. 2003-406441

(51) Int. Cl.
*H01L 21/322* (2006.01)
*H01L 21/4763* (2006.01)

(52) U.S. Cl. ............... 438/637; 438/475; 257/E21.212; 257/E21.218

(58) Field of Classification Search ................. 438/475; 257/E21.212, E21.213, E21.218
See application file for complete search history.

(56) References Cited

U.S. PATENT DOCUMENTS

| 6,107,192 A | 8/2000 | Subrahmanyan et al. |
| 6,174,796 B1 * | 1/2001 | Takagi et al. ................ 438/622 |

(Continued)

FOREIGN PATENT DOCUMENTS

EP  1 081 750 A2  3/2001

(Continued)

OTHER PUBLICATIONS

Sugawara et al., WO 2003/056622, Published Jul. 10, 2003 (machine translation also provided).*

(Continued)

*Primary Examiner*—Alexander G Ghyka
*Assistant Examiner*—Seahvosh J Nikmanesh
(74) *Attorney, Agent, or Firm*—Oblon, Spivak, McClelland, Maier & Neustadt, L.L.P.

(57) ABSTRACT

A method of cleaning a semiconductor substrate conductive layer surface that can remove a residual organic material and a natural oxide satisfactorily and does not adversely affect a k value without damaging the side-wall insulation film of a via hole. A semiconductor device, including insulation films formed on the surface of a conductive layer of a semiconductor substrate and a via hole formed in an insulation film to partly expose the conductive layer, is carried into a reaction vessel, plasma including hydrogen is generated in the reaction vessel to clean the surface of the conductive layer at the bottom of the via hole, a residual organic material is decomposed and removed by ashing, and a copper oxide film on the surface of the conductive layer is reduced to Cu.

17 Claims, 7 Drawing Sheets

U.S. PATENT DOCUMENTS

| | | | |
|---|---|---|---|
| 6,319,842 B1 | 11/2001 | Khosla et al. | |
| 6,350,675 B1 * | 2/2002 | Chooi et al. | 438/624 |
| 6,630,406 B2 * | 10/2003 | Waldfried et al. | 438/710 |
| 2003/0001277 A1 * | 1/2003 | Noguchi et al. | 257/773 |
| 2004/0023485 A1 * | 2/2004 | Pan et al. | 438/637 |
| 2004/0134613 A1 | 7/2004 | Ohmi et al. | |
| 2006/0099802 A1 * | 5/2006 | Lin et al. | 438/637 |

FOREIGN PATENT DOCUMENTS

| | | |
|---|---|---|
| EP | 1 300 878 A1 | 4/2003 |
| JP | 2001-85331 | 3/2001 |
| JP | 2001 203194 | 7/2001 |
| JP | 2003 224185 | 8/2003 |
| JP | 2003 258090 | 9/2003 |
| WO | WO 01/29879 A2 | 4/2001 |

OTHER PUBLICATIONS

Gi-Chung Kwon, et al., "New Plasma Source Development Using a Parallel Resonance Antenna for Dry Etching", IEEE International Conference on Plasma Science, vol. CONF. 30. Jun. 2, 2003. XP010658995, p. 403.

* cited by examiner

METHOD OF CLEANING SEMICONDUCTOR SUBSTRATE CONDUCTIVE LAYER SURFACE

FIELD OF THE INVENTION

The present invention relates to a method for cleaning a surface of a conductive layer on a semiconductor substrate; and, more particularly, to a method for cleaning a surface of a conductive layer exposed through a bottom portion of a via hole in a dual damascene structure in which a wiring contact hole and a via hole are formed simultaneously.

BACKGROUND OF THE INVENTION

Conventionally, in a semiconductor device, there has been used a method for depositing and planarizing an interlayer insulating film after a wiring has been formed. As an idea different from this, there is a dual damascene structure in which a wiring trench and a via hole are formed simultaneously. In this structure, since the via hole can be formed of a same material as that of the wiring trench, an interface resistance of a contact hole can be reduced, and an electromigration tolerance can be enhanced. Especially, in the dual damascene structure, hitherto demands for enhancing a film coatability to prevent a void from being formed between wirings become unnecessary, because the interlayer insulating film is always deposited on a planar surface.

A fabrication process of this dual damascene structure includes a process for cleaning the surface of the conductive layer exposed through the bottom portion of the via hole. In many cases, etching residue of organic materials such as photoresist or the like lies on the surface of the conductive layer beneath the bottom portion of the via hole. Further, a native oxide film is inevitably formed on the surface of the conductive layer. For example, in case the conductive layer is copper, copper oxide (CuO) is formed on the surface of the copper. Such residual organic material or oxide causes a problem in that it causes an electric resistance of a vie hole portion to increase.

It is known that the increase in the electric resistance of the via hole portion can be prevented by plasma processing a surface of a low-k film to form a detailed surface modification layer (see, for example, Japanese Patent Laid-Open application No. 2002-26121, Paragraph [0031] and FIG. 6).

Further, as a conventional method other than that disclosed in the above-mentioned document, there is a method for cleaning the surface of the conductive layer exposed through the bottom portion of the via hole. In this method, although the residual organic material is decomposed to be removed by injecting argon ions, since injecting the argon ions does not involve an ashing, residual organic material cannot be removed completely. Hence, the surface cannot be cleaned sufficiently. Further, native oxide cannot be removed. In addition, a damage is inflicted on an insulating film on a side wall of the via hole when the argon ions are injected, thus causing an adverse effect on the dielectric constant (k value).

SUMMARY OF THE INVENTION

It is, therefore, an object of the present invention to provide a method for cleaning a surface of a semiconductor substrate capable of sufficiently removing residual organic material and/or natural oxide, thereby preventing a damage on a side wall insulting film of a via hole, and preventing an adverse effect on the dielectric constant (k value).

In accordance with a first aspect of the present invention, there is provided a method for cleaning a surface of a conductive layer on a semiconductor substrate placed in a reaction chamber, wherein plasma containing hydrogen is generated in the reaction chamber, and the surface of the conductive layer is cleaned by being reduced therewith.

Since the oxide film can be removed by cleaning a surface of a conductive layer by generating plasma containing hydrogen in the reaction chamber such that the surface of the conductive layer is cleaned by being reduced therewith, the cleaning can be performed without increasing the electric resistance and the dielectric constant (k value).

Further, the residual organic material on the surface of the conductive layer is removed by being ashed with the plasma.

Further, an insulating layer is formed on the surface of the conductive layer, a via hole for exposing a part of the conductive layer is formed in the insulating layer, and the surface of the conductive layer exposed through a bottom portion of the via hole is cleaned by the plasma.

Further, an upper insulating film is further deposited on the insulating layer, and a wiring trench for exposing the via hole is formed in the upper insulating film, the exposed surface of the conductive layer being cleaned by the plasma after the upper insulating film has been formed.

Further, the above-mentioned steps of cleaning is performed using a high density plasma processing at a low electron temperature.

Further, the high density plasma processing is performed by forming a uniform electric field in the reaction chamber, the high density plasma being generated using microwave.

Further, the high density plasma processing is performed under an atmosphere of gaseous mixture containing hydrogen and helium, and ratio of the helium with respect to the hydrogen is set to be 0.005 to 20.

BRIEF DESCRIPTION OF THE DRAWINGS

FIG. 4 describes ashing rates of respective processing gases;

DETAILED DESCRIPTION OF THE PREFERRED EMBODIMENT

Hereinafter, a preferred embodiment in accordance with the present invention will be described with reference to accompanying drawings.

Figure 1:
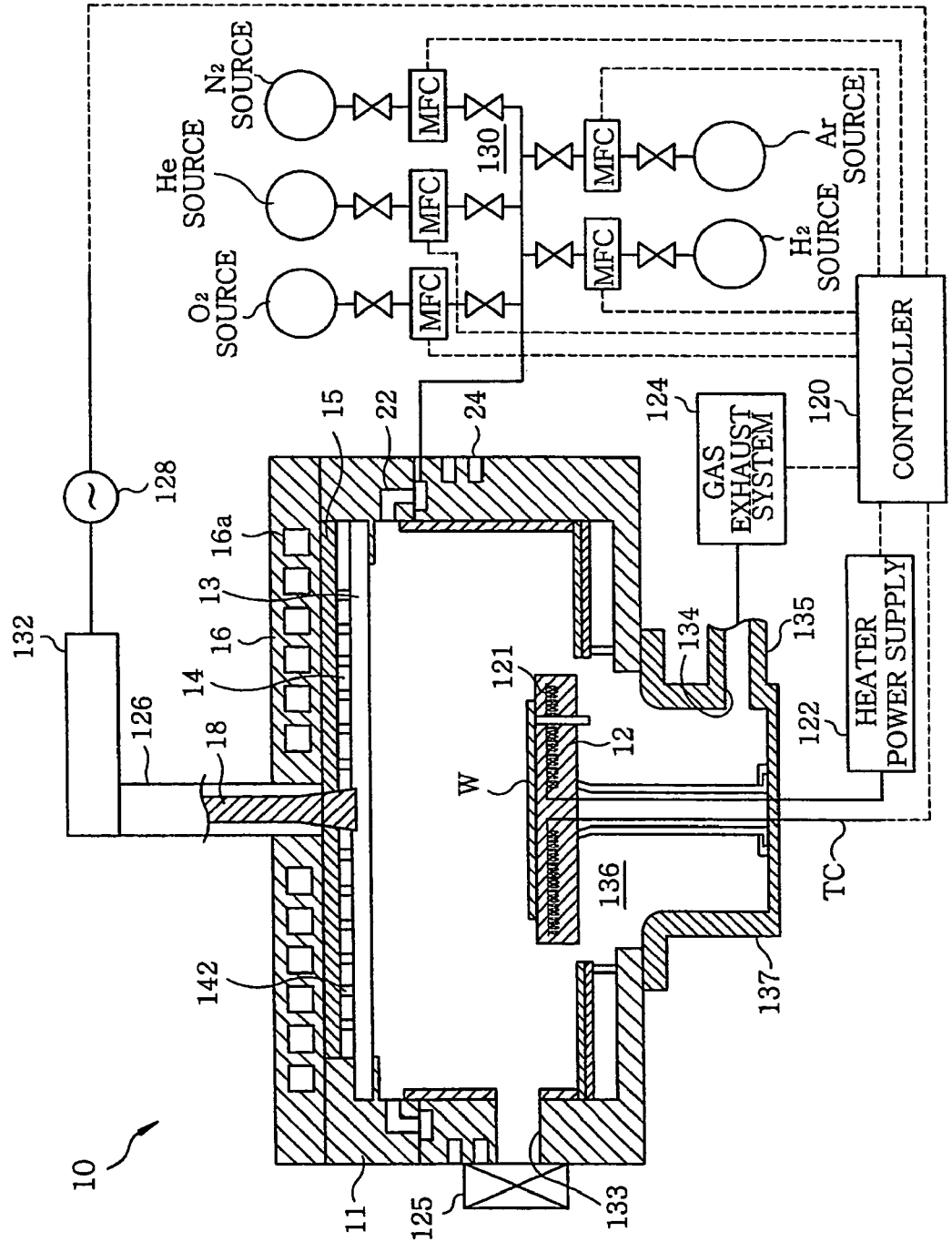
FIG. 1 shows a cross sectional view of a plasma processing apparatus used for cleaning a dual damascene structure.
Figure 2:
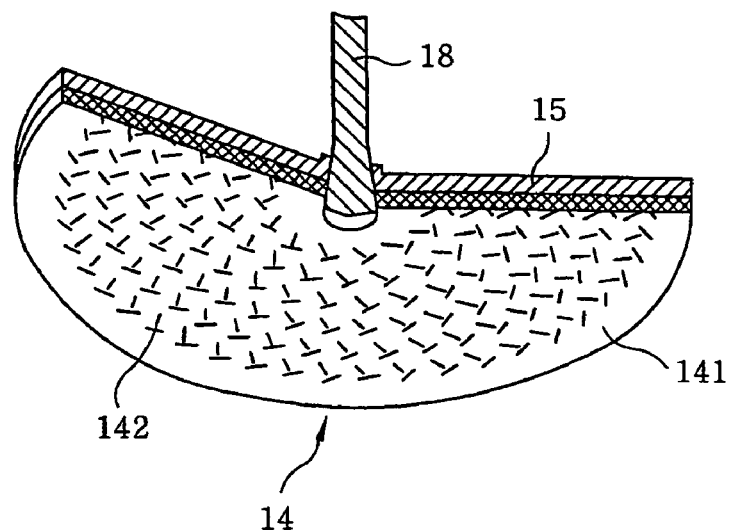
FIG. 2 illustrates a partial cutaway perspective view of a slot plate installed in the plasma processing apparatus shown in FIG. 1.

FIG. 1 shows a cross sectional view of a high density plasma processing apparatus 10 used for cleaning a dual damascene structure. FIG. 2 illustrates a partial cutaway perspective view of a slot plate installed in the high density plasma processing apparatus shown in FIG. 1.

The high density plasma processing apparatus 10 includes a processing chamber 11 having a substrate support 12 for supporting a semiconductor wafer W of a dual damascene structure. Gas in the processing chamber 11 is exhausted from an exhaust pipe 135 to a gas exhaust system 124 via a gas exhaust opening 136, an exhaust chamber 137 and an exhaust pipe opening 134. Further, the substrate support 12 includes a heater 121 for heating the semiconductor wafer W. The heater 121 is driven by an external heater power supply 122.

At an upper portion of the processing chamber 11 is formed an opening opposite to the semiconductor wafer W on the substrate support 12. The opening is closed up tightly by a dielectric plate 13 made of quartz, aluminum oxide or aluminum nitride. On an upper portion (outer portion) of the dielectric plate 13 is arranged a slot plate 14 functioning as an antenna (planar antenna) as shown in FIG. 2.

The slot plate 14 includes a circular conductive plate 141 made of a circular thin copper plate coated with gold or silver, and a plurality of T-shaped slits 142 are formed on the circular conductive plate 141. Further, the slots are formed radially in a direction of a radius, and gaps between the slits are preferably set to be $\lambda g/2$ or $\lambda g$, in which $\lambda g$ is the wavelength of the microwave in the waveguide 132. An electric field distribution that is uniform in the processing chamber 11 is formed by the slits 142.

On the upper portion (outer portion) of the slot plate 14 is arranged a dielectric plate 15 made of quartz, alumina and aluminum nitride. The dielectric plate 15 is also referred to as a retardation wave plate or a wave slow plate, and shortens a wavelength of a microwave by reducing a propagation velocity thereof, improving a propagation efficiency of the microwave radiating from the slot plate 14. On an upper portion (outer portion) of the dielectric plate 15 is disposed a covering member 16 made of metal (aluminum, stainless steel, or the like) to cover the slot plate 14 and the dielectric plate 15.

In the covering member 16 is installed a coolant channel 16a through which coolant flows, suppressing, for example, damages on members by refrigerating the dielectric plate 13 and the slot plate 14. Further, at a central portion of an upper end of the processing chamber is installed a rectangular waveguide 132 or a coaxial waveguide 132 for introducing a microwave from the microwave generating source 128. At walls of the processing chamber 11 are installed gas nozzles 22 for introducing gas, allowing various gases to be introduced as shown in FIG. 1.

By opening a gate valve 125, the semiconductor wafer W can be transferred via a transfer port 133.

On outer parts of the walls of the processing chamber 11 is formed the coolant channel 24 in a manner that it surrounds the chamber. A gas supply source 130, a gas exhaust system 120, a heater power supply 122 and the like are controlled by a controller 124, the controller including a CPU, memory storage media like a ROM and RAM, a hard disk, a CD-ROM driver and a transfer unit (not shown). By storing a software for performing the method for cleaning a surface of a conductive layer on the semiconductor substrate in accordance with the present invention in the hard disk or the ROM, or externally supplying the above-mentioned software by the CD-ROM or the like to transfer it to the RAM, the CPU in the controller 120 carries out the cleaning method in accordance with the present invention.

Figure 3:
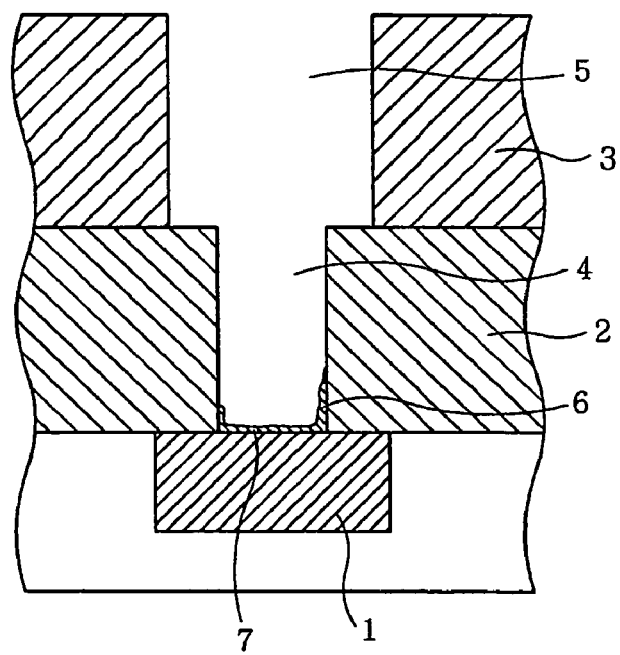
FIG. 3 offers a cross sectional view showing a dual damascene structure on a semiconductor substrate.

FIG. 3 offers a cross sectional view showing a dual damascene structure. As shown therein, interlayer insulating films 2 and 3 made of low-k films such as SiCOH are formed on a conductive layer 1 which is a Cu wiring layer. A via hole 4 functioning as a contact portion is formed in the interlayer insulating film 2, and a part of the conductive layer 1 is exposed through a bottom portion of the via hole. In the interlayer insulating film 3 is formed a wiring trench 5 for exposing the via hole 4. The via hole 4 and the wiring trench 5 are formed by etching. However, at that time, residual organic material 6 such as photoresist and the like remains on a surface of the conductive layer 1, and a copper oxide film 7 is formed thereon.

In accordance with the present invention, after a substrate of the dual damascene structure has been transferred into the processing chamber 11 in the high density plasma processing apparatus 10 shown in FIGS. 1 and 2, a gas including hydrogen is introduced into the processing chamber 11, and hydrogen-containing plasma is generated in the processing chamber 11. Then, the residual organic material 6 on side walls of the interlayer insulating films 2 and 3 is decomposed and removed by an ashing, and, at the same time, the copper oxide film 7 on the surface of the conductive layer 1 exposed through the via hole 4 is reduced to copper (Cu) by controlling a pressure in a reaction chamber and a duration of the hydrogen-containing plasma generation.

It can be considered to use processing gases such as an $Ar/O_2/He$ gas, an $Ar/N_2/H_2$ gas and an $Ar/He/H_2$ gas for removing the residual organic material 6 by generating plasma using the high density plasma processing apparatus 10. However, more preferably, by performing a plasma processing with a high density plasma of $10^{10}$ to $10^{13}/cm^3$ at a low electron temperature (0.7 eV to 2 eV) by the high density plasma processing apparatus 10 under an atmosphere of the $Ar/He/H_2$ gas to ash the residual organic material 6, the residual organic material 6 can be decomposed to be removed, and the copper oxide film 7 can be reduced to copper without inflicting damage on the interlayer insulating films 2 and 3 or increasing the k value.

Figure 4:
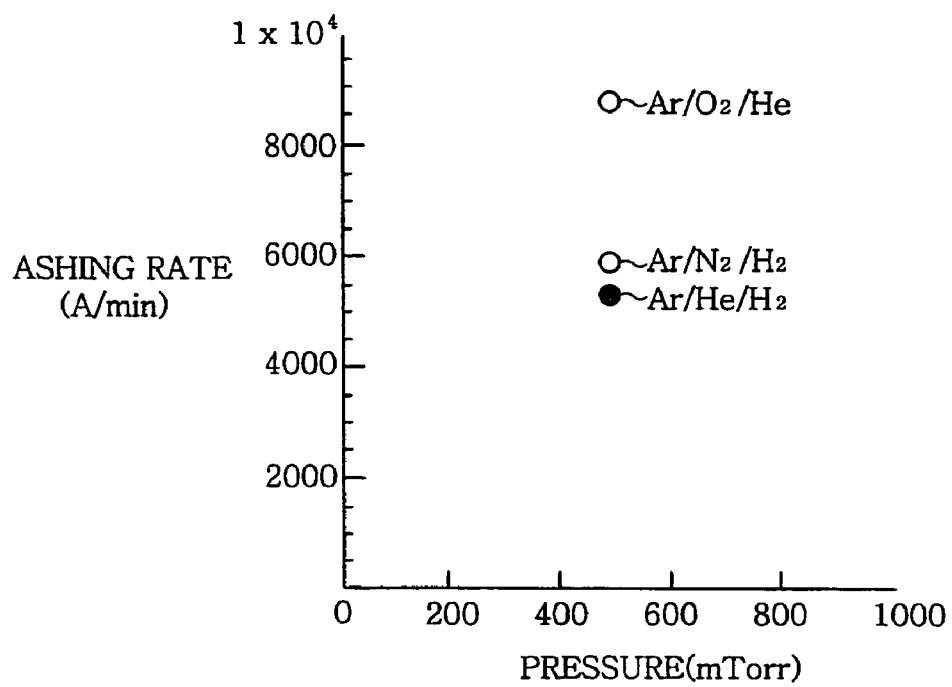
FIG. 4 describes ashing rates of respective processing

In FIG. 4, ashing rates are compared in cases of ashing the photoresist with the $Ar/O_2/He$ gas, the $Ar/N_2/H_2$ gas and the $Ar/He/H_2$ gas introduced into the processing chamber 11 under the conditions that the flow rate ratio was 1000/200/200 sccm, the pressure in the processing chamber 11 was 500 mTorr, the output power of the microwave was 1.5 kW, the gap between the dielectric plate 132 and the substrate W was 105 mm, and the temperature in the processing chamber 11 was 250° C. As shown in FIG. 4, the ashing rate of the $Ar/O_2/He$ gas including oxygen is the highest, that of the $Ar/N_2/H_2$ gas is the second highest, and that of the $Ar/He/H_2$ gas is the lowest.

Figure 5A:
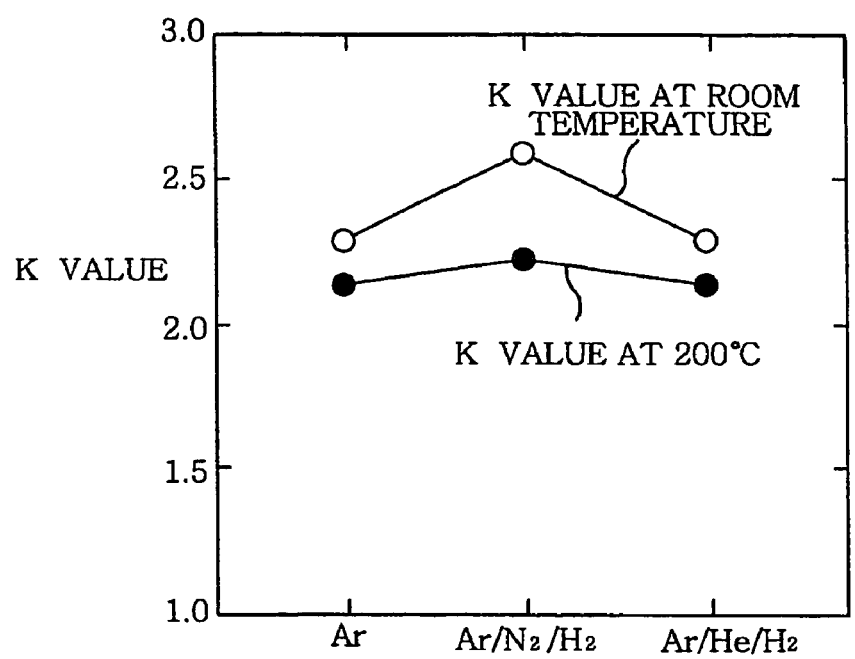
FIG. 5A represents k values of the insulating film for carrying out the processes using respective processing gases.
Figure 5B:
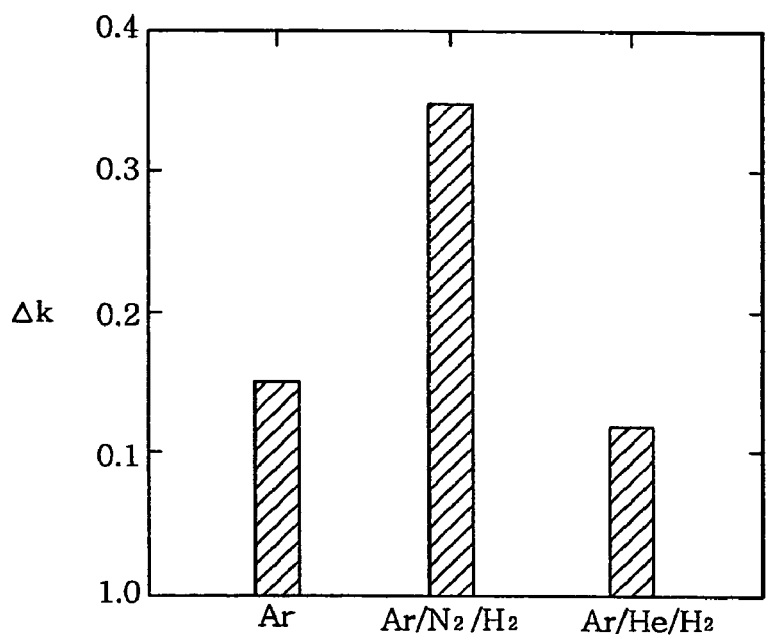
FIG. 5B shows Δk values of the insulating film for carrying out the processes using the respective processing gases.

Further, FIGS. 5A and 5B show k values and $\Delta k$ values depending on the processing gas. Specifically, FIG. 5A shows k values in case of processing the low-k films at a room temperature and at 200° C. by using an Ar gas, the $Ar/N_2/H_2$ gas and the $Ar/He/H_2$ gas, respectively, as the processing gas. FIG. 5B shows differences $\Delta k$ between the k values in case of processing the low-k films at a room temperature and at 200° C. The vertical axes represent the k value and the Δk value, respectively.

As shown in FIG. 5A, in case of using the Ar gas, the difference Δk between the k values for carrying out the processes at a room temperature and at 200° C. is as small as about 0.15. In case of using the Ar/N$_2$/H$_2$ gas, the difference Δk between the k values in case of processing at a room temperature and at 200° C. is as large as about 0.35. Further, in case of using the Ar/H$_2$/He gas, the difference Δk between the k values for carrying out the processes at a room temperature and at 200° C. is about 0.12, which means the variation is the smallest in this case. Although the Ar gas has the smallest difference Δk of 0.15, the residual organic material 6 cannot be removed completely as described in the above-mentioned prior art. Therefore, between the above-mentioned two gases including H$_2$, the Ar/He/H$_2$ gas, having smaller Δk, is more suitable for ashing the residual organic material 6 than the Ar/N$_2$/H$_2$ gas, because the k value does not increase when exposed to the plasma. Further, it is preferable to set the conditions such that a plasma damage is not inflicted on the low k film without raising the k value.

Figure 6:
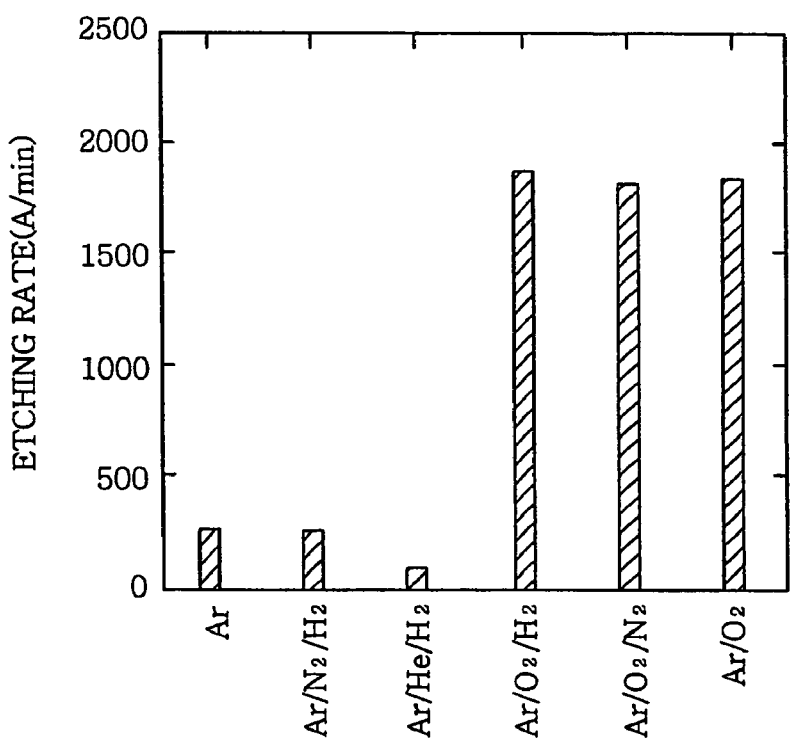
FIG. 6 presents etching rates of respective processing gases with respect to SiOCH.

Further, FIG. 6 shows etching rates of the respective processing gases with respect to SiOCH (interlayer insulating film). As shown therein, whereas etching rates of the Ar gas, the Ar/N$_2$/H$_2$ gas and the Ar/He/H$_2$ gas are no more than about 200 A/min, the etching rates of gases including oxygen such as the Ar/O$_2$/He gas, the Ar/O$_2$/N$_2$ gas and the Ar/O$_2$ gas are as large as about 1900 A(angstrom)/min. From this, it can be deduced that the etching rates of the Ar gas, the Ar/N$_2$/H$_2$ gas and the Ar/He/H$_2$ gas are lower than those of the Ar/O$_2$/He gas, the Ar/O$_2$/N$_2$ gas and the Ar/O$_2$ gas, and that the etching rate of the Ar/He/H$_2$ gas is the lowest, minimizing the damage on the interlayer films 2 and 3.

Comparing the results, although the Ar/O$_2$/He gas has a high ashing rate and is suitable for removing the residual organic material 6 as described in FIG. 4, it also has a high etching rate, and thus the side walls of the interlayer insulating films 2 and 3 may become etched, increasing the damages on the side walls, making it improper to use the Ar/O$_2$/He gas as the processing gas.

On the other hand, although the Ar/He/H$_2$ gas and the Ar/N$_2$/H$_2$ gas have low ashing rates as shown in FIG. 4, the etching rates thereof are also low as shown in FIG. 6, minimizing the damage on the interlayer films 2 and 3, thus making the Ar/He/H$_2$ gas and the Ar/N$_2$/H$_2$ gas suitable as the processing gas. Comparing the Ar/He/H$_2$ gas and the Ar/N$_2$/H$_2$ gas, the Ar/He/H$_2$ gas is more suitable as the processing gas, because the Ar/He/H$_2$ gas has a lower Δk than the Ar/N$_2$/H$_2$ gas as shown in FIG. 5.

Figure 7:
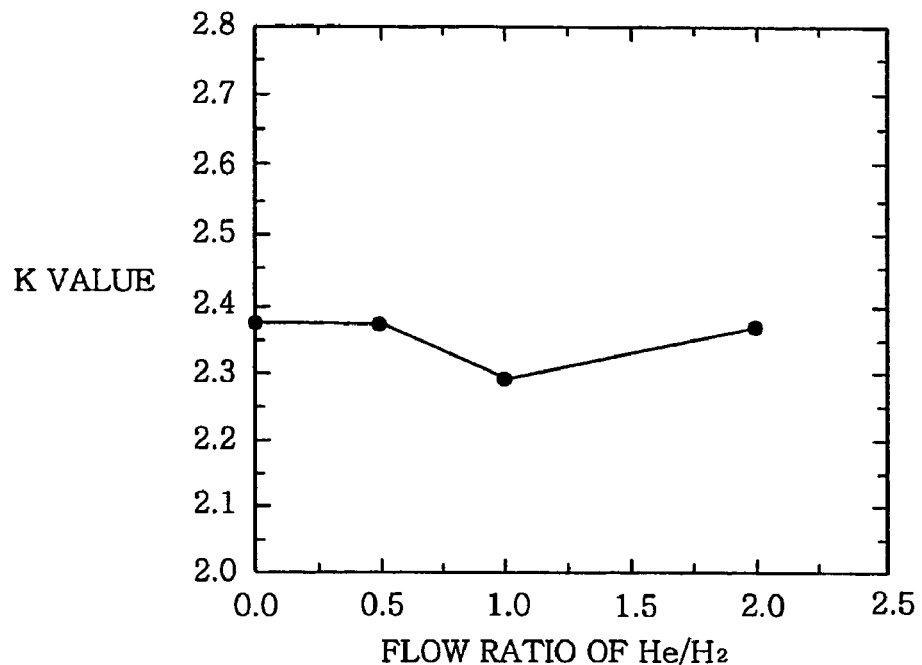
FIG. 7 depicts k values of the insulating film depending on flow rate ratios of He/H$_2$ gas.

FIG. 7 illustrates flow ratios of the He gas with respect to the H$_2$ gas in the Ar/He/H$_2$ gas. As shown therein, the k value is about 2.36 when the flow ratio of the He gas with respect to the H$_2$ gas is about 0.0 to 0.5. Then, the k value begins to fall when the flow ratio reaches about 0.5. The k value is no more than about 2.35 when the flow ratio of the He gas with respect to the H$_2$ gas is about 0.7 to 1.75, and therefore, it is preferable to set the flow ratio of the He gas with respect to the H$_2$ gas to be within this range, as a consequence of only H radicals contributing to the decomposition of the residue material.

Figure 8:
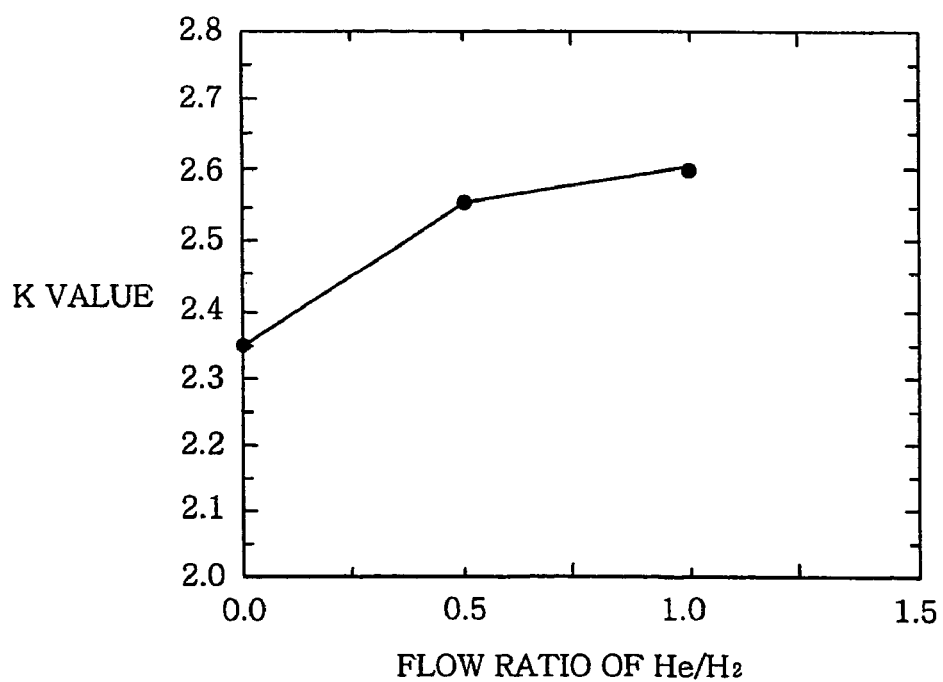
FIG. 8 describes k values of the insulating film depending on flow rate ratios of N$_2$/H$_2$ gas.

FIG. 8 illustrates flow ratios of the N$_2$ gas with respect to the H$_2$ gas in the Ar/N$_2$/H$_2$ gas. As shown therein, the k value is about 2.37 to 2.55 when the flow ratio of the N$_2$ gas with respect to the H$_2$ gas is about 0.0 to 0.5, and the k value is about 2.55 to 2.6 when the flow ratio is about 0.5 to 1.0, as a consequence of N radicals being introduced into the insulating films.

Comparing the results, it can be seen that the change in the k value with respect to the change in the flow rate ratio is smaller for the Ar/He/H$_2$ gas than the Ar/N$_2$/H$_2$ gas. Therefore, by performing the high density plasma processing on the substrate of the dual damascene structure shown in FIG. 3 at a low electron temperature under an atmosphere of the Ar/He/H$_2$ gas using the high density plasma processing apparatus 10 to ash the residual organic material 6, the residual organic material 6 can be decomposed and removed most efficiently without inflicting any damage on the interlayer insulating films 2 and 3 and increasing the k value.

Figure 9:
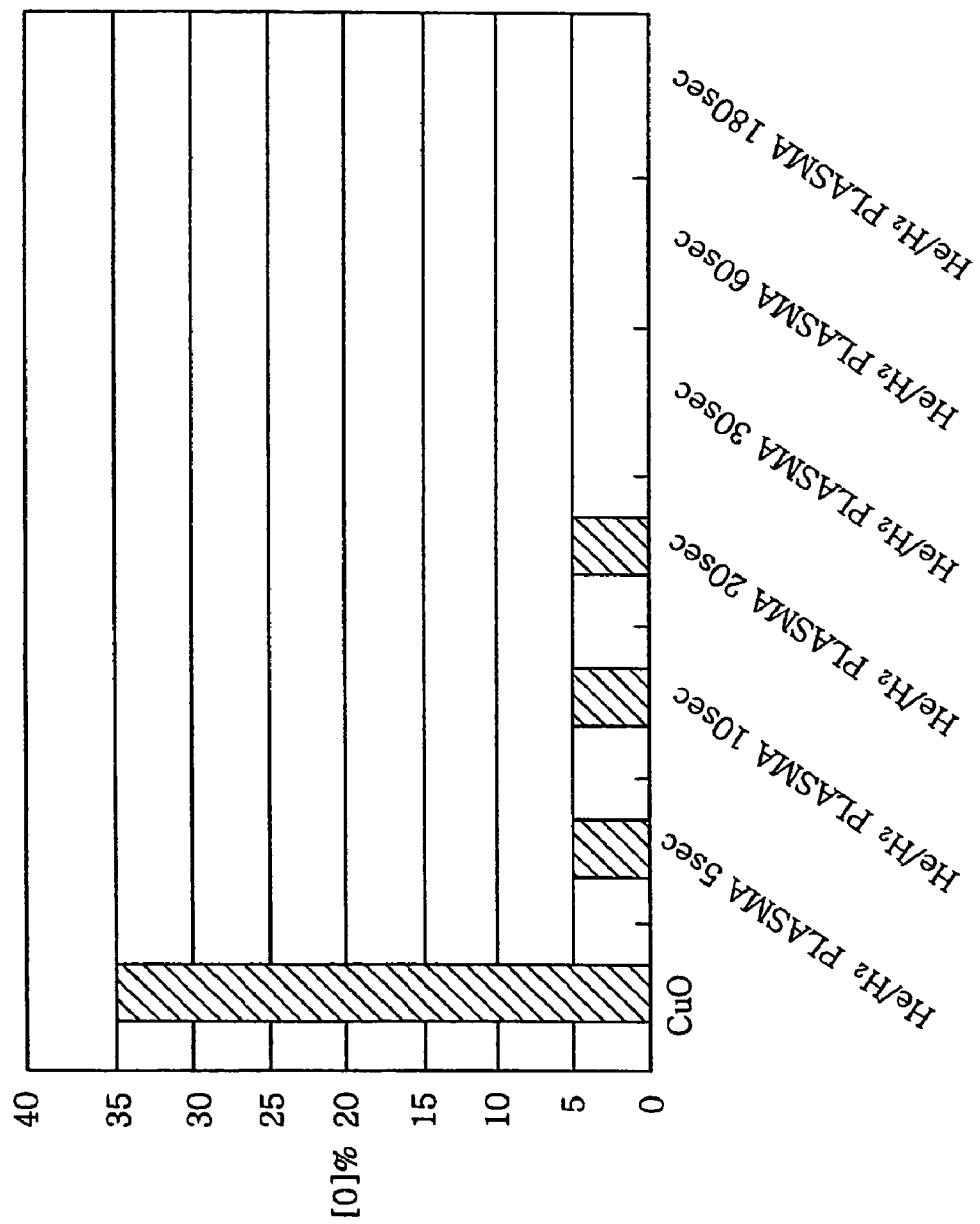
FIG. 9 sets forth oxygen reduction characteristics depending on emitting time when plasma using the He/H$_2$ gas is emitted onto CuO.

FIG. 9 shows oxygen reduction characteristics when plasma using the He/H$_2$ gas is emitted onto the copper oxide film 7, wherein the vertical axis represents of the oxygen content (in atomic %).

As shown in FIG. 9, the copper oxide film originally includes oxygen by 35 atomic %. However, the oxygen content is reduced to 5 atomic % when CuO is exposed to the He/H$_2$ plasma for 5 sec, the oxygen content remaining thereat when CuO is exposed to the He/H$_2$ plasma for 10 sec or 20 sec. Thereafter, the oxygen content is reduced to about 0 atomic % when CuO is exposed to the He/H$_2$ plasma for 30, 60 or 180 sec, making possible a deduction that the copper oxide film 7 is reduced to Cu to form a clean surface of Cu.

Therefore, it is most preferable to generate hydrogen-containing plasma using such as Ar/He/H$_2$ gas to ash the low-k films with the high density plasma at a low electron temperature, so that the residual organic material 6 on the side walls of the oxide insulating film 2 and 3 is removed, and the copper oxide film 7 on the surface of the conductive layer 1 is reduced to Cu. Preferably, the conditions are as follows: the flow rate ratio of Ar is 500 to 3000 sccm; the flow rate ratio of He is 50 to 1000 sccm; the flow rate ratio of H$_2$ is 50 to 1000 sccm; the pressure is 100 mmTorr to 5 Torr; the output power is 0.5 to 3 kW; the temperature is higher than a room temperature; and the processing time below 500° C. is 20 to 600 seconds.

Figure 10:
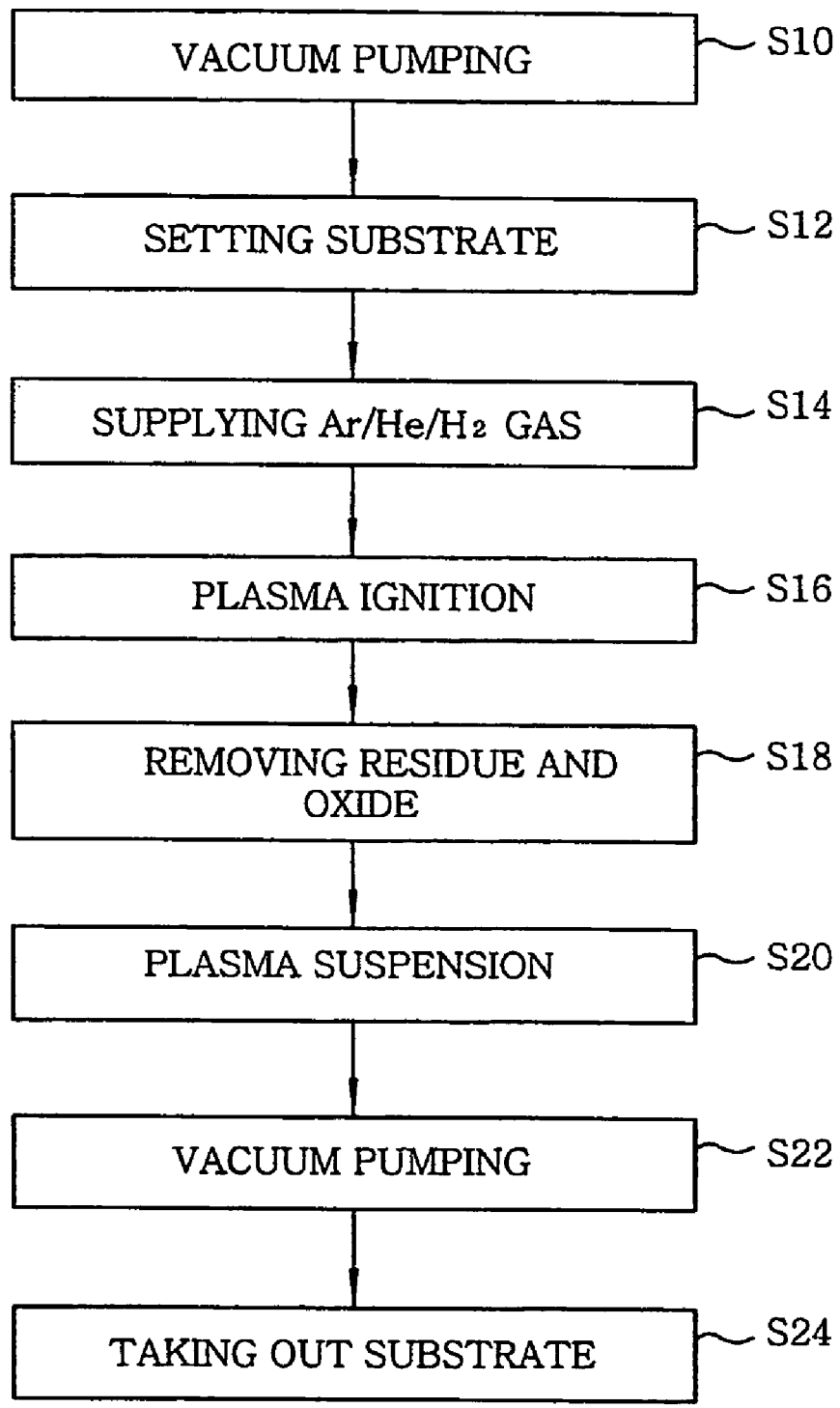
FIG. 10 is a flow chart showing an operation sequence in accordance with the cleaning method of the present invention.

Referring the flow chart of FIG. 10, an operation sequence in accordance with the present invention will be described briefly.

After vacuum pumping (S10), a substrate W of the dual damascene structure is transferred from another chamber (not shown) adjacent to the processing chamber 11 via the transfer port 133, and then set in the processing chamber 11 (S12). The gas supply source 130 supplies, typically, the Ar/He/H$_2$ gas into the processing chamber 11 (S14). Microwaves are propagated from the microwave generating source 128 into the processing chamber 11, thereby generating plasma (S16) (a high density plasma processing with a plasma density of $10^{10}$ to $10^{13}$/cm$^3$ at a low electron temperature (0.7 to 2 eV). By controlling the duration of the hydrogen-containing plasma generation, the residual organic material 6 on the side walls of the interlayer insulating films 2 and 3 is decomposed and removed by an ashing (S18). At the same time, the copper oxide film 7 on the surface of the conductive layer 1 exposed through a bottom portion of the via hole 4 is reduced to Cu. Thereafter, the plasma is stopped (S20), and then a vacuum pumping is performed (S22). Subsequently, the substrate W is taken out of the processing chamber 11 (S24).

Further, while the present invention can clean and remove the residual organic material such as photoresist, the present invention can also be applied to a case of cleaning a surface of a conductive layer of tungsten, copper, WSi, NiSi, CoSi or the like exposed through a wiring contact hole.

So far, a preferred embodiment in accordance with the present invention has been described with reference to the drawings. However, the present invention is not limited thereto.

INDUSTRIAL APPLICABILITY

The present invention can be applied to a plasma substrate processing apparatus for reducing the copper oxide film 7 on the surface of the conductive layer 1 to Cu by transferring a semiconductor device into the processing chamber 11; generating hydrogen-containing plasma in the processing chamber 11; cleaning the conductive layer 1 at a bottom portion of the via hole 4; and decomposing to remove the residual organic material 6 by an ashing.

What is claimed is:

1. A method for cleaning a surface of a conductive layer on a semiconductor substrate placed in a reaction chamber, comprising:
    forming an insulating layer on the surface of the conductive layer;
    forming a via hole in the insulating layer to expose a part of the conductive layer through a bottom of the via hole;
    generating plasma containing hydrogen, helium and argon in the reaction chamber; and
    cleaning the part of the conductive layer exposed through the bottom of the via hole using the plasma,
    wherein a residual organic material on the part of the conductive layer exposed through the bottom of the via hole is ashed by the plasma while the surface of the part of the conductive layer exposed through the bottom of the via hole is reduced.

2. The method of claim 1, wherein an upper insulating film is further formed on the insulating layer, and a wiring trench for exposing the via hole is formed in the upper insulating film, the exposed surface of the conductive layer being cleaned by the plasma after the upper insulating film has been formed.

3. The method of claim 1, wherein a density of the plasma is $10^{10}$ to $10^{13}/cm^3$.

4. The method of claim 1, wherein an electron temperature of the plasma is 0.7 to 3 eV.

5. The method of claim 3, wherein an electron temperature of the plasma is 0.7 to 3 eV.

6. The method of claim 3, wherein the plasma is generated by using a planar antenna.

7. The method of claim 3, wherein the plasma is inductively coupled plasma or magnetron plasma.

8. The method of claim 6, wherein the high density plasma processing is performed by forming a uniform electric field in the reaction chamber, the high density plasma being generated using microwave.

9. The method of claim 1, wherein plasma processing is performed under an atmosphere of a gaseous mixture, and flow ratio of the helium with respect to the hydrogen is set to be 0.005 to 20.

10. The method according to claim 1, wherein a flow rate of argon is between 500 sccm and 3000 sccm, a flow rate of helium is between 50 sccm and 1000 sccm, and a flow rate of hydrogen is between 50 sccm and 1000 sccm.

11. The method according to claim 10, wherein a ratio of the flow rate of helium to the flow rate of hydrogen is between 0.7 and 1.75.

12. A computer-readable storage medium storing software for performing a cleaning method for cleaning a surface of a conductive layer on a semiconductor substrate in a reaction chamber, the software when executed by a computer cause the computer to perform the cleaning method comprising:
    generating plasma containing hydrogen, helium and argon in the reaction chamber; and
    cleaning the surface of the conductive layer by reducing the surface of the conductive layer with the plasma,
    wherein an insulating layer is formed on the surface of the conductive layer, the insulating layer including a via hole to expose a part of the conductive layer to the plasma, the part of the conductive layer being cleaned by the plasma, and
    a residual organic material on the surface of the part of the conductive layer is ashed by the plasma while the surface of the part of the conductive layer is reduced.

13. The computer-readable storage medium of claim 12, wherein an upper insulating film is further deposited on the insulating layer, and a wiring trench for exposing the via hole is formed in the upper insulating film, the exposed surface of the conductive layer being cleaned using the plasma after the upper insulating film has been formed.

14. The computer-readable storage medium of claim 12, wherein the cleaning is performed by a high density plasma processing at a low electron temperature, and the generating plasma is performed by forming a uniform electric field in the reaction chamber, a high density plasma being generated using microwave.

15. The computer-readable storage medium of claim 12, wherein the generating plasma is performed under an atmosphere of a gaseous mixture, and ratio of the helium with respect to the hydrogen is set to be 0.005 to 20.

16. The computer-readable medium according to claim 12, wherein a flow rate of argon is between 500 sccm and 3000 sccm, a flow rate of helium is between 50 sccm and 1000 sccm, and a flow rate of hydrogen is between 50 sccm and 1000 sccm.

17. The computer-readable medium according to claim 16, wherein a ratio of the flow rate of helium to the flow rate of hydrogen is between 0.7 and 1.75.

* * * * *